(12) United States Patent
Shen

(10) Patent No.: US 7,719,112 B2
(45) Date of Patent: May 18, 2010

(54) ON-CHIP MAGNETIC COMPONENTS

(75) Inventor: Zheng John Shen, Oviedo, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 0 days.

(21) Appl. No.: 11/835,144

(22) Filed: Aug. 7, 2007

(65) Prior Publication Data

US 2008/0029845 A1  Feb. 7, 2008

Related U.S. Application Data

(60) Provisional application No. 60/836,010, filed on Aug. 7, 2006.

(51) Int. Cl.
*H01L 29/00* (2006.01)
*H01L 21/02* (2006.01)
*H01L 23/49* (2006.01)

(52) U.S. Cl. .................. 257/746; 257/784; 257/786; 257/E21.022; 257/E29.001; 257/E23.024; 257/531; 438/3

(58) Field of Classification Search ............ 257/746, 257/531, 784, 786, E21.001, E23.024
See application file for complete search history.

(56) References Cited

U.S. PATENT DOCUMENTS

| 5,606,196 A * | 2/1997 | Lee et al. ............... 257/503 |
| 6,330,165 B1 * | 12/2001 | Kohjiro et al. ............... 361/760 |
| 6,429,044 B1 * | 8/2002 | Tuttle ............... 438/106 |
| 6,635,961 B2 * | 10/2003 | Yoshida et al. ............... 257/728 |
| 6,903,440 B2 * | 6/2005 | Yoshida et al. ............... 257/593 |
| 7,091,791 B1 * | 8/2006 | Terrovitis ............... 330/301 |
| 2002/0024116 A1 * | 2/2002 | Tuttle ............... 257/630 |
| 2004/0155332 A1 * | 8/2004 | Petty-Weeks et al. ....... 257/734 |
| 2004/0188833 A1 * | 9/2004 | Yoshida et al. ............... 257/728 |
| 2005/0122198 A1 * | 6/2005 | Zhou et al. ............... 336/200 |
| 2006/0065966 A1 * | 3/2006 | Zhou et al. ............... 257/692 |
| 2008/0246547 A1 * | 10/2008 | Blednov ............... 331/109 |

FOREIGN PATENT DOCUMENTS

JP         7-192948     *  7/1995

\* cited by examiner

*Primary Examiner*—Alexander O Williams
(74) *Attorney, Agent, or Firm*—Thomas, Kayden, Horstemeyer & Risley, LLP (57) ABSTRACT

An integrated circuit chip comprising a bond wire and a mass of magnetic material provided on the bond wire, wherein the mass of magnetic material increases the inductance of the bond wire.

24 Claims, 8 Drawing Sheets

ON-CHIP MAGNETIC COMPONENTS

CROSS-REFERENCE TO RELATED APPLICATION

This application claims priority to copending U.S. provisional application entitled, "On-Chip Magnetic Components," having Ser. No. 60/836,010, filed Aug. 7, 2006, which is entirely incorporated herein by reference.

BACKGROUND

Various electronic devices comprise power supplies that convert electricity from one form into another. For example, most computing devices, such as desktop computers, laptop computers, and personal digital assistants comprise power supplies that convert voltage into a form that can be used by the various components of the devices, such as central processing units (CPUs) or other processors. Conversion may comprise alternating current (AC) to direct current (DC) conversion, as well as DC to DC conversion. In the former case, AC voltage, for example from a wall outlet, is converted into DC voltage, which is used by the internal components of the electronic device. In the latter case, the DC voltage is reduced to a level required by the internal components.

Current power supplies comprise various discrete components, such as inductors and capacitors, that are separately manufactured and then mounted, for example, on a circuit board. Due to the aggregation of the various discrete components, such power supplies are relatively large and heavy. Although not necessarily a critical concern in terms of larger electronic devices such as desktop computers, the size and heft of conventional power supplies can be disadvantageous for some applications, such as mobile electronic devices.

System-on-chip (SOC) is an emerging trend of integrating all components of an electronic system including digital, analog, mixed-signal, communication, and sensor functions into a single integrated circuit. The proliferation of the SOC concept has generated interest in integrating power management into integrated circuit chips. Power SOCs that monolithically integrate all active and passive components using low-cost semiconductor manufacturing processes would provide an extremely attractive solution with significant improvement in performance, as well as an unprecedented reduction in board space, parts count, and time to market. Unfortunately, the development of power SOCs is seriously hindered by a few major technical barriers. One such barrier is development of a cost effective means of integrating inductors and transformers onto a silicon chip while achieving adequate performance in terms of inductance, DC series resistance, maximum saturation current, and quality factor (Q factor), which is the ratio of reactive impedance to equivalent series resistance (ESR), and therefore provides a measure of inductor performance.

Current research on integrated magnetics for power SOCs has predominantly focused on utilizing micro-electro-mechanical-system (MEMS) micromachining technology as a post-processing step after the completion of a chip (e.g., a complementary metal-oxide-semiconductor (CMOS) chip) containing all power switching devices and control circuitry. The high DC resistance (typically 0.5 to 5 ohms ($\Omega$)) and poor Q factor (typically 3 to 8) of the MEMS inductors/transformers, however, severely limit the current handling capability and efficiency of the power SOC. Furthermore, the large increase of fabrication complexity and cost associated with the MEMS post-processing approach raises questions as to the feasibility of large scale commercialization of the power SOC.

BRIEF DESCRIPTION OF THE DRAWINGS

The disclosed systems, methods, and apparatus can be better understood with reference to the following drawings. The components in the drawings are not necessarily to scale.

DETAILED DESCRIPTION

From the above, it can be understood that it would be desirable to have power supplies that are smaller in size and/or weight. In some cases, it would be particularly desirable to have power systems-on-chips (power SOCs). As described in the following, power SOCs that integrate active and passive components using low-cost semiconductor manufacturing processes can be manufactured by forming magnetic components on bond wires of the chip. In some embodiments, the magnetic components comprise magnetic material that is held to the bond wires with a suitable binder.

Figure 1:
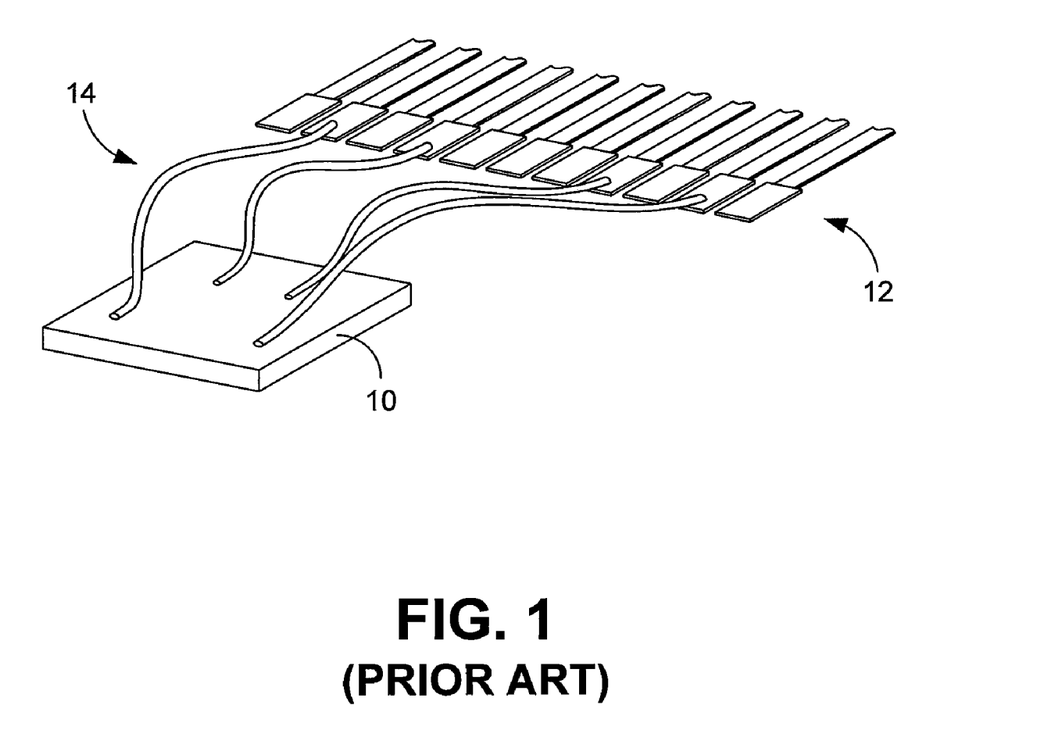
FIG. 1 is a perspective view of an example conventional electrical connection between an integrated circuit chip and various leads.

Turning to the figures, in which like numerals identify corresponding components, FIG. 1 shows an example of conventional electrical connection of an integrated circuit (IC) chip 10 to various leads 12, for example provided in a lead frame of an electronic package (partially shown). Various contacts of the chip 10 are connected to the circuit board leads 12 using bond wires 14. Such bond wires 14 may provide power to the chip 10 or may be used to transmit signals to and from the chip. Given that the bond wires 14 are made of electrically conductive materials, such as gold or aluminum, and since current flows through the bond wires, the bond wires act as natural inductors.

Although the bond wires 14 act as natural inductors, the inductance created by the bond wires is typically insufficient for power converter applications. By way of example, the bond wires may exhibit an inductance of only a few nano-Henrys (nH) (e.g., approximately 3-4 nH), whereas higher inductance, for example in the range of several tens of nH, may be required for power SOCs.

Increased inductance can be achieved by adding magnetic material to the bond wires. For example, powdered ferrite can be sintered on the bond wires to increase their inductance. Unfortunately, such sintering requires very high temperatures and/or chemical processing techniques that are inconsistent with the processes used to fabricate semiconductor (e.g., silicon) chips. More particularly, the temperatures and/or chemicals currently used can damage the chip.

Figure 2:
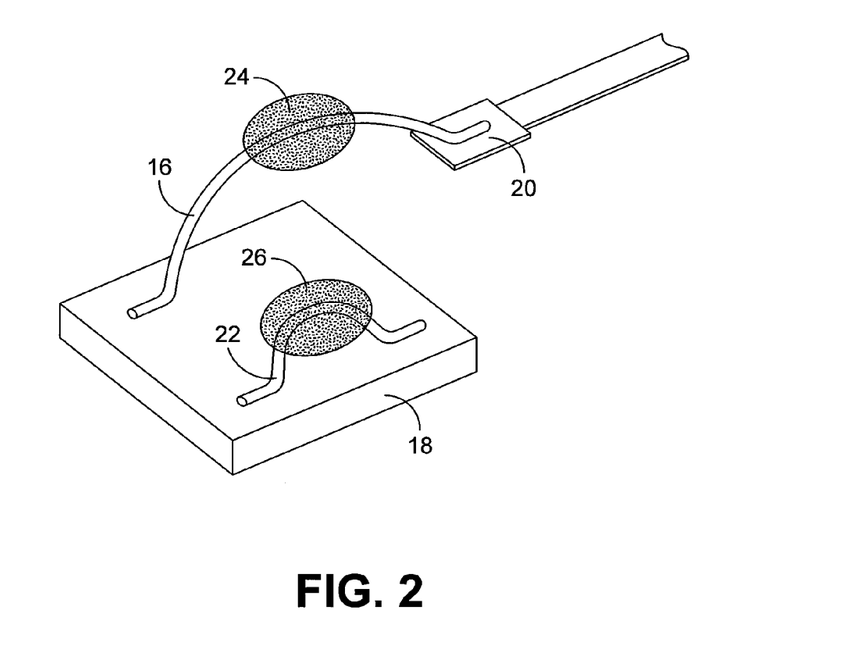
FIG. 2 is a perspective view of a first embodiment of a chip having bond wires to which magnetic material has been applied.
Figure 3:
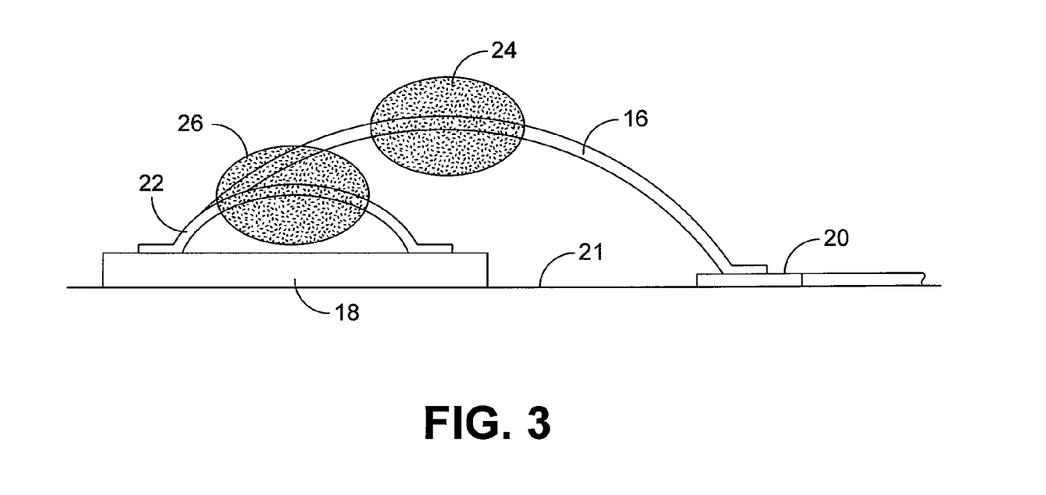
FIG. 3 is a side view of the embodiment illustrated in FIG. 2.

The above difficulties can be avoided by adding magnetic material to the bond wires using a fabrication process that is compatible with chip fabrication. For example, particles of a magnetic metal, such as ferrite, can be mixed with an appropriate binder material, such as an epoxy, and the solution can be applied to the bond wires to increase their inductance. FIGS. 2 and 3 illustrate an embodiment of such application. As indicated in those figures, a first bond wire 16 extends upwardly from the plane of a top surface of a power supply chip 18 to a separate lead 20. By way of example, both the chip 18 and the lead 20 are provided on a package lead frame 21 (FIG. 3). In addition, a second bond wire 22 connects two discrete points on the chip 18 and also extends upwardly from the plane of the top surface of the chip. As is further shown in the figures, each bond wire 16, 22 is provided with a mass 24, 26 of magnetic material, such as powdered ferrite suspended in epoxy, on a portion of the bond wire that is beyond the plane of the top surface of the chip 18. In the embodiment of FIGS. 2 and 3, the masses 24 and 26 each comprise a bead of material. By way of example, the beads can have a thickness (e.g., central diameter) of approximately 20-100 microns (μm) and can be provided on the bond wires 16, 22 by brushing, squeegeeing, dipping, dripping, inking, or other viable techniques. In some embodiments, the chip 18 can be flipped (i.e., inverted) and the bond wires 16, 22 dipped in a solution comprising the magnetic material. In other embodiments, the beads can be provided on the bond wires 16, 22 using robotics that apply the beads to the bond wires with a high degree of precision. Irrespective of the method used to apply the magnetic material, once the magnetic material has been applied, it can be dried and, if necessary, cured at a temperature below 200° C.

Figure 4:
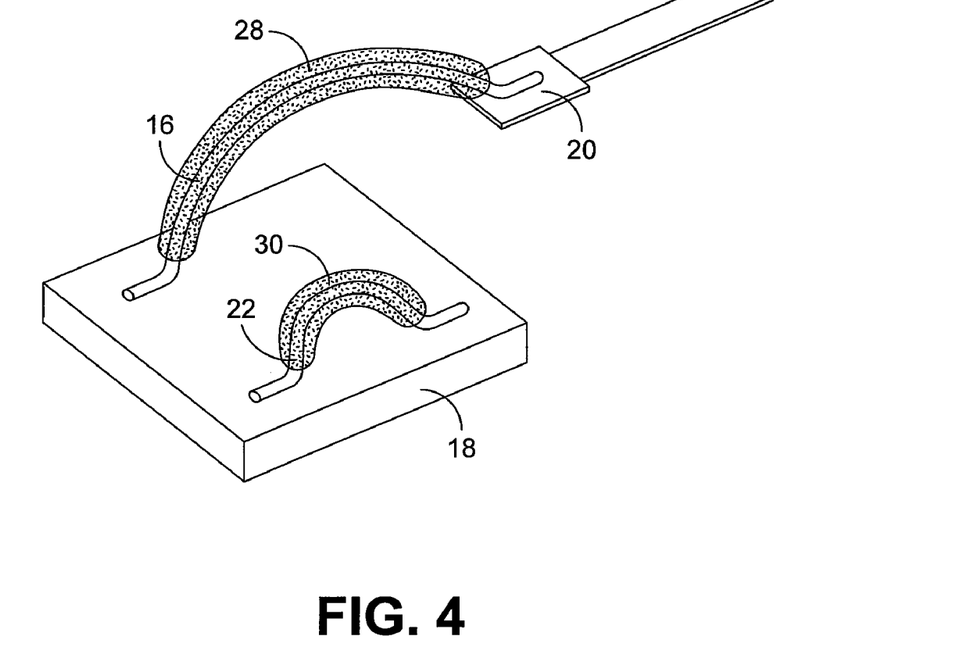
FIG. 4 is a perspective view of a second embodiment of a chip having bond wires to which magnetic material has been applied.

FIG. 4 illustrates a further embodiment. In that embodiment, larger portions of the bond wires 16, 22 are coated with a mass 28, 30 of magnetic material. Specifically, substantially the entire lengths of the bond wires 16, 22 are coated with the magnetic material. Generally speaking, the greater the amount of magnetic material that is applied to the bond wires, the greater the increase in inductance that can be achieved given that increased mass yields reduced magnetic reluctance and greater magnetic flux. By way of example, the application of magnetic material can increase the natural inductance of the bond wires by at least a factor of 5-10.

Figure 5:
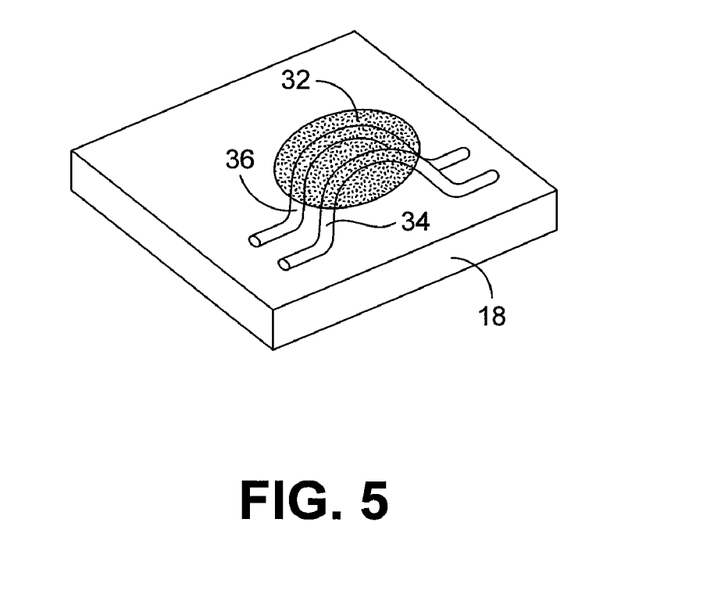
FIG. 5 is a perspective view of a third embodiment of a chip having bond wires to which magnetic material has been applied.

FIG. 5 illustrates yet another embodiment. In that embodiment, a single mass 32 of magnetic material is applied to multiple bond wires, in particular a primary bond wire 34 and a secondary bond wire 36, to form a transformer.

The above-described power SOCs enable various advantages that are difficult to achieve with existing technologies, such as MEMS inductors. For example, each of the control circuitry, power switches, gate drivers, feedback compensation networks, and the like can be fabricated with standard silicon processing technology, eliminating the need for costly post-CMOS MEMS processing steps. In addition, the on-chip bond wire inductors and transformers can be integrated into the power SOC packaging process with minimal changes, thereby facilitating cost-effective, high current, high efficiency power SOCs. Furthermore, aluminum and gold bond wires, due to their relatively large diameters, are much more conductive than the thin metal films in MEMS inductors. Therefore, a much lower DC resistance and higher Q factor can be expected for the bond wire inductors. Moreover, the electromagnetic field of a bond wire inductor is mainly distributed outside the silicon substrate. Therefore, Eddy power loss in the silicon substrate at high frequency, which is a major concern in MEMS magnetics, can be reduced or minimized.

Experimentation

On-chip bond wire inductors were investigated using two types of ferrite epoxy composite materials. The first material was a custom formulated magnetic epoxy comprised of manganese-zinc (MgZn) ferrite powder with an average particle size of 10 μm, a thermoplastic resin, and a solvent from the Methode Development Corporation. The manganese-zinc ferrite loading powder is commercially available (Steward 73300). The average surface area of the powder was 1.4 square meters per gram ($m^2/g$). The saturation moment of the bulk powder was 79.4 electromagnetic units per gram (emu/g). The cured ferrite composite (no solvent) comprised 96% by mass ferrite with the balance consisting of polymer. The effective permeability was between 12 and 16. The second material was a ferrite nanocomposite from the Inframat Corporation that was comprised of very fine $(NiZn)Fe_2O_4$ nanoparticles with an average size of 5-15 nanometers (nm) and a commercial epoxy.

Testing was conducted on standalone copper wires. The copper wires had fixed lengths of 20 mm and respective diameters of 250 μm (10 mil) and 500 μm (20 mil) to emulate bond wires in IC packages. The ferrite epoxy materials were manually brushed onto the copper bond wires to form a ferrite beads. Curing comprised a thermal treatment of the ferrite beads in an oven at 140° C. for thirty minutes for both ferrite epoxy materials. The ferrite-polymer composites displayed negligible conductivity and therefore were electrically self-isolated from the bare copper bond wires.

Figure 6:
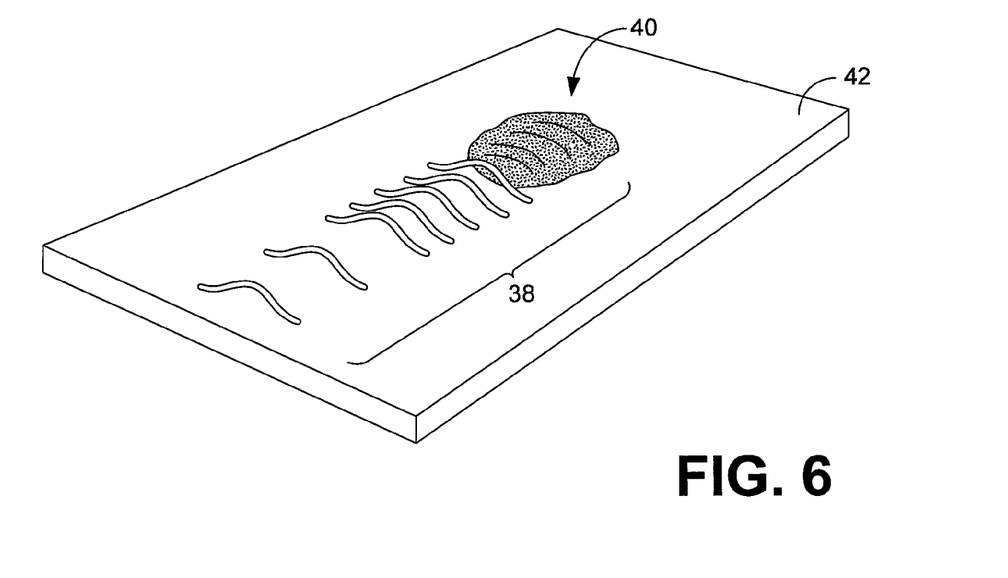
FIG. 6 is a perspective view of a fourth embodiment of a chip having bond wires to which magnetic material has been applied.

Testing was also conducted on aluminum bond wires that were bonded onto a printed circuit board (PCB) substrate. FIG. 6 depicts the aluminum bond wires 38 with and without a ferrite epoxy bead 40 on the PCB substrate 42. The wirebonding was conducted on a Electrodyne M20 wirebonder using 5 mil aluminum bond wires.

Each of the bond wire inductors were characterized with HP 4284A high precision LCR meters in a low frequency range up to 1 MHz. DC resistance was measured with an Instek 801H milli-ohm meter. High frequency measurement was performed using an Agilent 8753 S-parameter network analyzer. The Q factor and inductance were then determined using the following equations:

$$L_{eff} = -\frac{1}{\omega \text{Im}(y_{11})} \qquad \text{[Equation 1]}$$

$$Q = -\frac{\text{Im}(y_{11})}{\text{Re}(y_{11})} \qquad \text{[Equation 2]}$$

where $L_{eff}$ is inductance, Q is the Q factor, w is the frequency, and $y_{11}$ is the y parameter reading from the network analyzer, with Im and Re being the imaginary and real components of $y_{11}$, respectfully.

Figure 7:
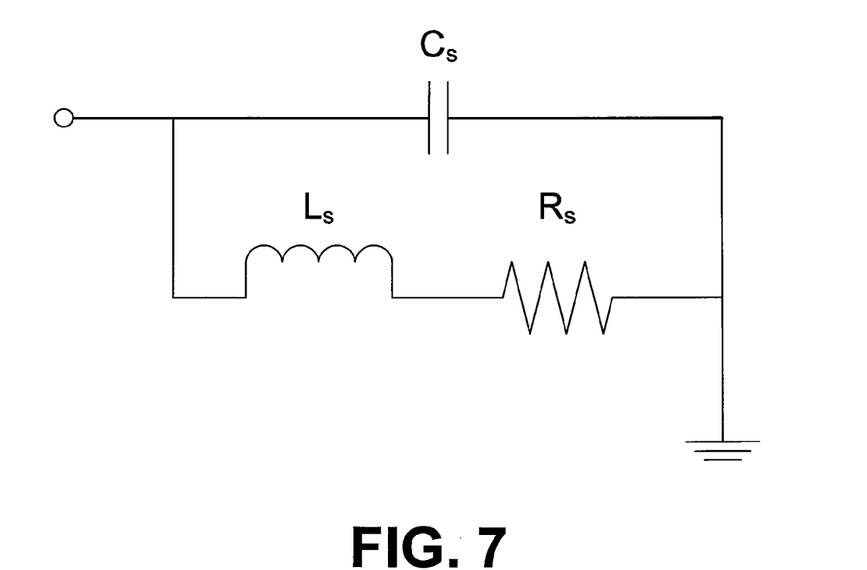
FIG. 7 is a simplified circuit model of a bond wire inductor.
Figure 8:
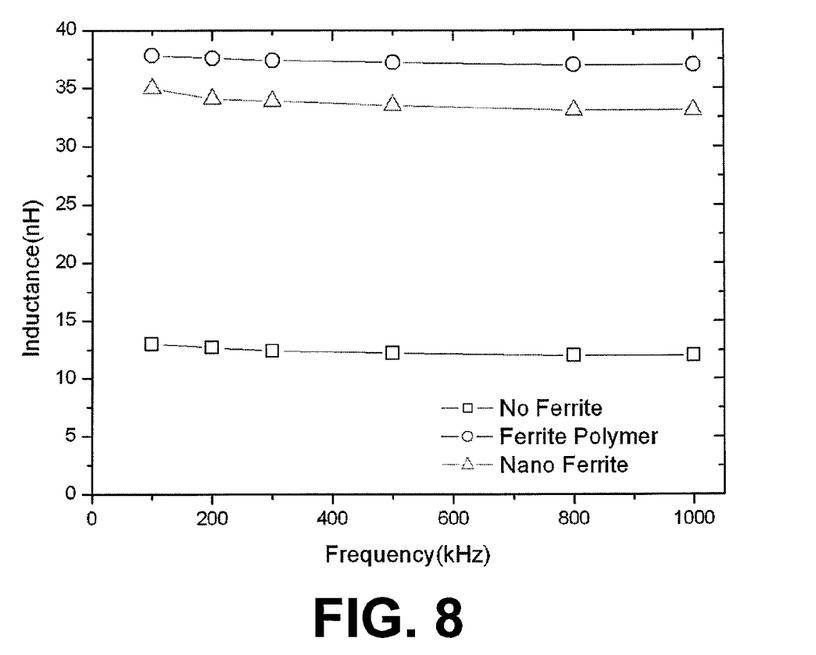
FIG. 8 is a graph that compares measured inductance for various bond wire inductors.
Figure 9:
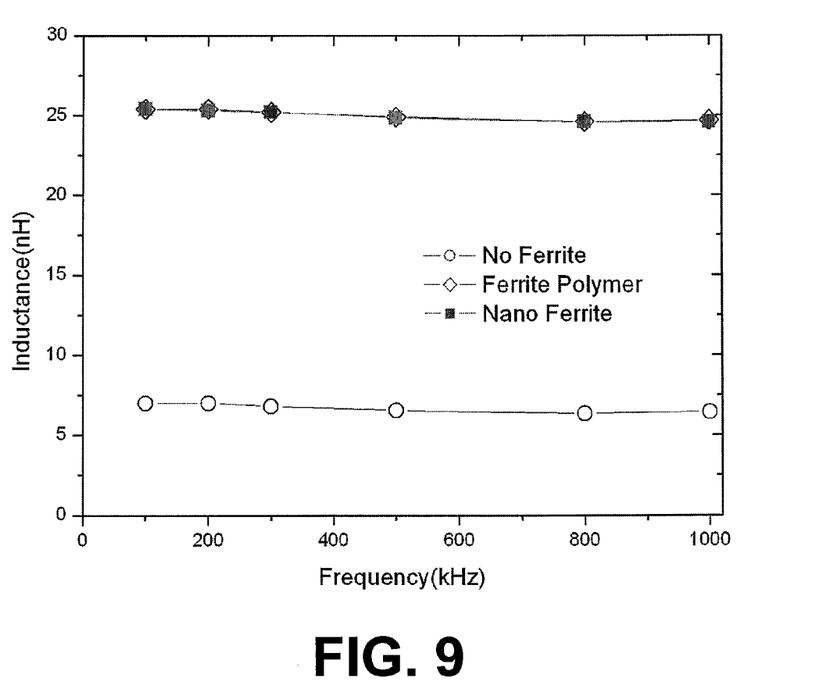
FIG. 9 is a graph that compares measured inductance for various bond wire inductors.

FIG. 7 illustrates the simplified equivalent model of the bond wire inductor that was used in electrical parameter extraction, with a capacitor, $C_s$, connected in parallel with an inductor, $L_s$, and a resistor, $R_s$. FIGS. 8 and 9 show the measured inductance for the 10 mil and 20 mil bond wire inductors with no ferrite bead, the ferrite polymer bead, and the ferrite nanocomposite bead, respectively. The inductance of the bare copper wires was increased by a factor of 2.8 to 3.5 with the addition of the ferrite epoxy beads. The DC resistance of the 10 mil and 20 mil bond wire inductors was measured as 7.1 mΩ and 1.7 mΩ, respectively, using an Instek 801H milli-ohm meter. The 10 mil bond wire inductor demonstrated an inductance of 38 nH and a DC resistance of 7.1 mΩ.

Figure 10:
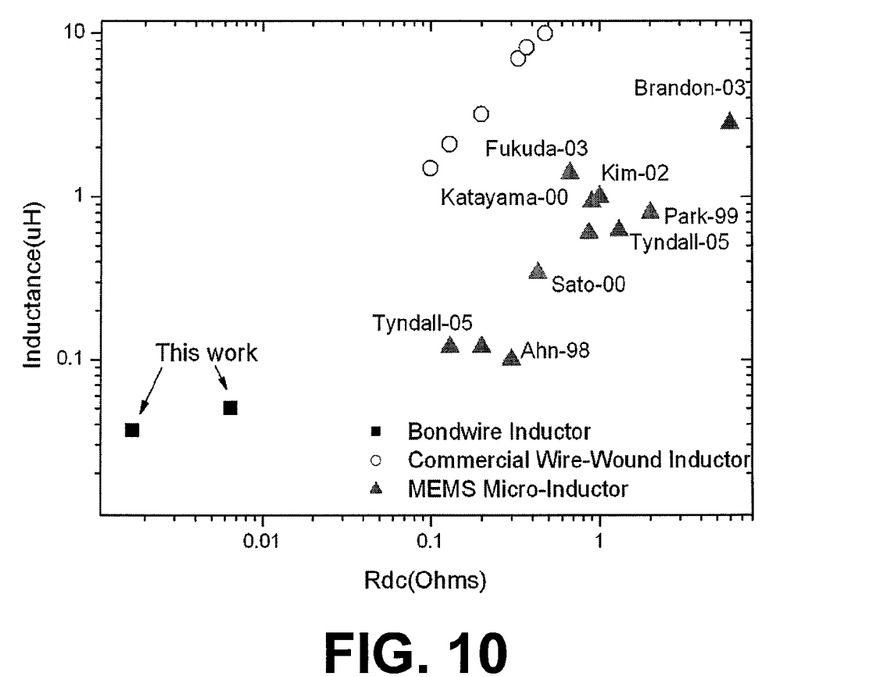
FIG. 10 is a graph that compares measured inductance of MEMS micro-inductors, wire-wound inductors, and bond wire inductors.

FIG. 10 compares the state-of-the-art MEMS micro-inductors, commercial wire-wound inductors, and the bond wire inductors evaluated in the experimentation (i.e., "in this work") in terms of inductance and DC winding resistance achieved. As is apparent from the results shown in FIG. 10, the bond wire inductors offer a solution for high current power SOC applications in which the MEMS micro-inductors fall short.

Figure 11:
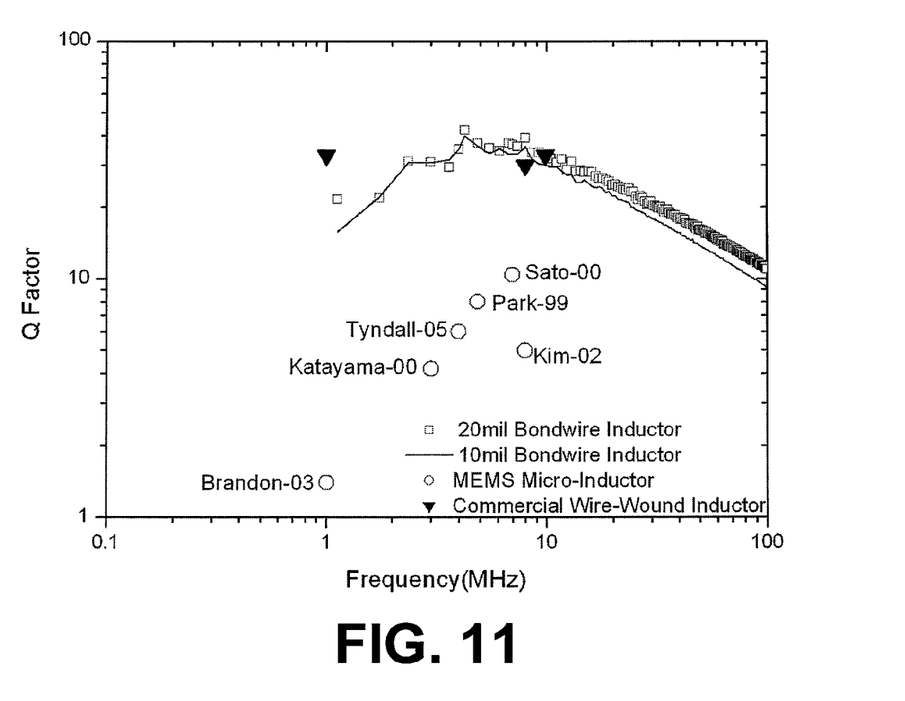
FIG. 11 is a graph that compares determined Q factor of MEMS micro-inductors, wire-wound inductors, and bond wire inductors.

FIG. 11 compares the Q factor of the three evaluated approaches. The bond wire inductors demonstrated a Q factor of 30-40 in a frequency range of 2 to 20 MHz, which is similar to that of the commercial wire-wound inductors but 3-30 times higher than that of the MEMS micro-inductors.

Figure 12:
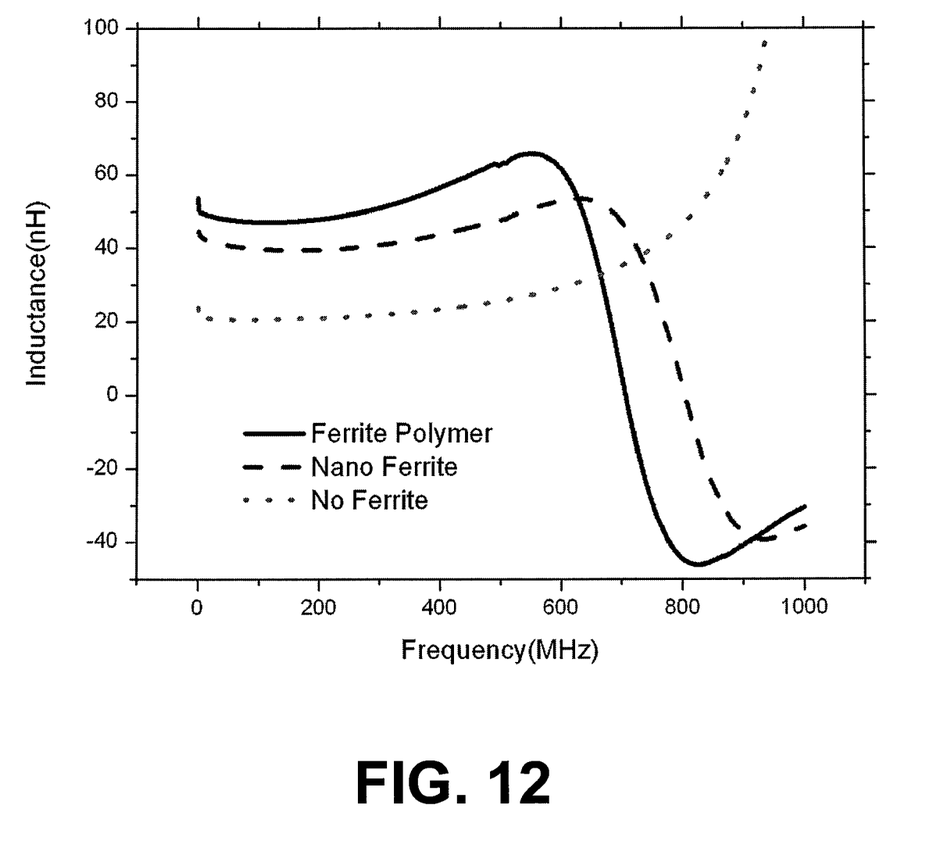
FIG. 12 is a graph that identifies measured inductance for bond wire inductors over a high frequency range.

FIG. 12 shows the measured inductance of the bond wire inductors over a high frequency range, indicating a self-resonant frequency between 700 and 800 MHz.

Figure 13:
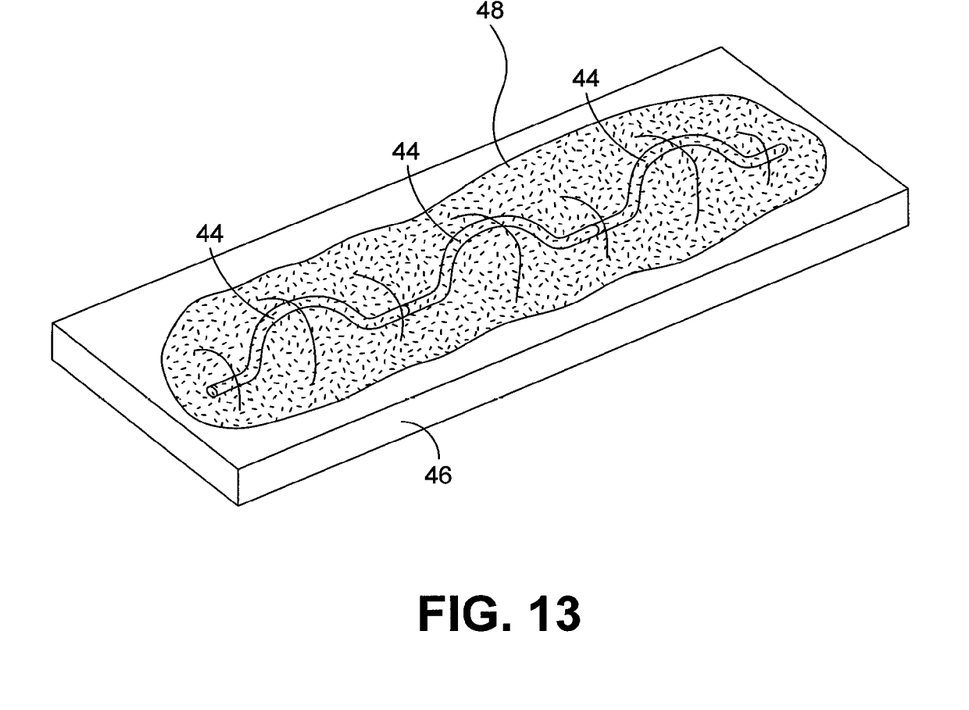
FIG. 13 is a perspective view of a fifth embodiment of a chip having bond wires to which magnetic material has been applied.

FIG. 13 illustrates yet another embodiment illustrating use of magnetic material. In the embodiment of FIG. 13, a plurality of bond wires 44 are connected in series with each other on a semiconductor chip 46 and the bond wires are at least partially encapsulated by magnetic material 48.

In the foregoing, powdered ferrite and ferrite nanoparticles have been identified as magnetic materials that can be used to increase the inductance of the bond wires. It is noted, however, that other magnetic materials may be used. Furthermore, the magnetic material need not be in powdered form. For example, a solid magnetic mass can, in some embodiments, be adhered or otherwise attached to the bond wires. Furthermore, although epoxy and thermoplastic resin have been identified as binder materials in cases in which the magnetic material is suspended in a binder material, other binder materials, such as polymeric and/or organic materials, can be used. Moreover, a binder material or adhesive may not be necessary. For example, magnetic material, such as magnetic metal, can, in some embodiments, be applied to the bond wires in a molten state.

It is further noted that the inductance provided to the power SOC is "free" given that the natural inductance of the bond wires is leveraged to form the magnetic component, thereby providing a convenient and inexpensive solution to power management. Furthermore, it is noted that the inductance is provided without a concomitant increase of parasitic resistance, resulting in high Q factors. Moreover, although the addition of the magnetic material to bond wires has been described herein for power SOC applications, it is noted that the present techniques can be used to form a magnetic component in association with substantially any chip.

The following are claimed:

1. A semiconductor chip comprising:
   a bond wire; and
   a mass of magnetic material provided on the bond wire, the mass of magnetic material comprising magnetic particles suspended in a binder material, the mass of magnetic material not contacting the chip, wherein the mass of magnetic material increases the inductance of the bond wire.

2. The chip of claim 1, wherein the bond wire extends beyond a plane of a surface of the chip.

3. The chip of claim 2, wherein the bond wire extends from a point on the chip surface to a separate component to which the chip is electrically connected.

4. The chip of claim 2, wherein the bond wire extends between two discrete points on the chip surface.

5. The chip of claim 1, wherein the mass of magnetic material comprises a bead of magnetic material that is provided on a portion of the bond wire that extends beyond a plane of a surface of the chip.

6. The chip of claim 1, wherein the mass of magnetic material substantially covers a portion of the bond wire that extends beyond a plane of a surface of the chip.

7. The chip of claim 1, wherein the magnetic particles comprise ferrite particles.

8. The chip of claim 7, wherein the ferrite particles comprise powdered ferrite material.

9. The chip of claim 7, wherein the ferrite particles comprise a ferrite nanocomposite.

10. The chip of claim 1, wherein the binder material comprises an epoxy.

11. The chip of claim 1, wherein the binder material comprises a thermoplastic resin.

12. A semiconductor chip comprising:
    multiple bond wire; and
    a mass of magnetic material provided on the bond wires, the mass of magnetic material comprising magnetic particles suspended in a binder material, the mass of magnetic material not contacting the chip, wherein the mass of magnetic material increases the inductance of the bond wires.

13. The chip of claim 12, wherein the bond wires are not directly connected to each other.

14. The chip of claim 12, wherein the bond wires are directly connected to each other in series.

15. The chip of claim 1, wherein the chip is a power management integrated circuit chip.

16. A power system-on-chip that integrates substantially all active and passive components used in power management, the power system-on-chip comprising:
    a top surface;
    a conductive bond wire that comprises a portion that extends upwardly beyond the plane of the top surface; and
    a mass of magnetic material that encapsulates at least part of the bond wire portion but does not contact the chip, the mass comprising a ferrite material that is suspended within a binder material, wherein the mass of magnetic material increases the inductance of the bond wire.

17. The power system-on-chip of claim 16, wherein the mass of magnetic material substantially encapsulates the entirety of the bond wire portion that extends upwardly beyond the plane of the top surface.

18. The power system-on-chip of claim 16, wherein the mass of magnetic material substantially encapsulates the entire bond wire.

19. The power system-on-chip of claim 16, wherein the ferrite material comprises a powdered ferrite material.

20. The power system-on-chip of claim 16, wherein the ferrite material comprises ferrite nanocomposite.

21. The power system-on-chip of claim 16, wherein the binder material comprises an epoxy.

22. The power system-on-chip of claim 16, wherein the binder material comprises a thermoplastic resin.

23. A power system-on-chip that integrates substantially all active and passive components used in power management, the power system-on-chip comprising:

a top surface;

multiple bond wires that extend upwardly beyond the plane of the top surface; and a mass of magnetic material that encapsulates at least part of the bond wire portions but does not contact the chip, the mass comprising a ferrite material that is suspended within a binder material, wherein the mass of magnetic material increases the inductance of the bond wires.

24. The power system-on-chip of claim 16, wherein the bond wire exhibits a quality factor of approximately 30-40.

* * * * *